(12) United States Patent  
Li (10) Patent No.: US 9,312,191 B2
(45) Date of Patent: Apr. 12, 2016

(54) BLOCK PATTERNING PROCESS FOR POST FIN

(71) Applicant: GLOBALFOUNDRIES INC., Grand Cayman (KY)

(72) Inventor: Wai-kin Li, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/459,407

(22) Filed: Aug. 14, 2014

(65) Prior Publication Data

US 2016/0049339 A1 Feb. 18, 2016

(51) Int. Cl.
| | |
|---|---|
| *H01L 21/02* | (2006.01) |
| *H01L 21/84* | (2006.01) |
| *H01L 21/027* | (2006.01) |
| *H01L 21/3065* | (2006.01) |
| *H01L 21/311* | (2006.01) |
| *H01L 21/265* | (2006.01) |
| *H01L 21/8238* | (2006.01) |

(52) U.S. Cl.
CPC .......... *H01L 21/845* (2013.01); *H01L 21/0276* (2013.01); *H01L 21/02118* (2013.01); *H01L 21/26513* (2013.01); *H01L 21/3065* (2013.01); *H01L 21/31138* (2013.01); *H01L 21/823821* (2013.01); *H01L 21/823857* (2013.01)

(58) Field of Classification Search
CPC ....... G03F 7/091; G03F 7/0035; G03F 7/094; G03F 7/26; H01L 21/0276; H01L 2/0274
USPC ........................ 438/692, 694, 703, 758, 759
See application file for complete search history.

(56) References Cited

U.S. PATENT DOCUMENTS

| | | | |
|---|---|---|---|
| 5,858,621 A | 1/1999 | Yu et al. | |
| 8,088,554 B2 | 1/2012 | Hatakeyama | |
| 8,153,351 B2 | 4/2012 | Wallow et al. | |
| 8,367,303 B2 | 2/2013 | Keller et al. | |
| 8,563,229 B2 | 10/2013 | Tran | |
| 2004/0241984 A1* | 12/2004 | Schwan et al. | ................ 438/637 |
| 2004/0266201 A1* | 12/2004 | Wille et al. | ................ 438/706 |
| 2007/0057325 A1* | 3/2007 | Hsu et al. | .................. 257/347 |
| 2007/0075351 A1* | 4/2007 | Schulz et al. | ................ 257/314 |

(Continued)

FOREIGN PATENT DOCUMENTS

| | | |
|---|---|---|
| EP | 2287667 A1 | 2/2011 |
| EP | 2287667 B1 | 3/2013 |
| WO | 2008106379 A1 | 9/2008 |

*Primary Examiner* — Bradley K Smith
*Assistant Examiner* — David Goodwin
(74) *Attorney, Agent, or Firm* — Scully, Scott, Murphy & Presser, P.C.

(57) ABSTRACT

A method of reducing etch time needed for patterning an organic planarization layer (OPL) in a block mask stack so as to minimize damages to gate structures and fin structures in a block mask patterning process is provided. The block mask stack including an OPL, a developable antireflective coating (DARC) layer atop the OPL and a photoresist layer atop the DARC layer is employed to mask one conductivity type of FinFET while exposing the other conductivity type FinFET during source/drain ion implantation. The OPL is configured to have a minimum thickness sufficient to fill in spaces between semiconductor fins and to cover the semiconductor fins. The DARC layer is configured to planarize topography of semiconductor fins so as to provide a planar top surface for the ensuing lithography and etch processes.

17 Claims, 8 Drawing Sheets

(56) References Cited

U.S. PATENT DOCUMENTS

| | | |
|---|---|---|
| 2007/0275330 A1 | 11/2007 | Bailey et al. |
| 2012/0045721 A1 | 2/2012 | Printz et al. |
| 2012/0045722 A1 | 2/2012 | Printz et al. |
| 2013/0189850 A1* | 7/2013 | Takei et al. .................. 438/759 |
| 2014/0273457 A1* | 9/2014 | Su et al. ........................ 438/692 |
| 2015/0111384 A1* | 4/2015 | Chang .................. C08F 220/18 438/694 |

* cited by examiner

BLOCK PATTERNING PROCESS FOR POST FIN

BACKGROUND

The present application relates to semiconductor device fabrication, and more particularly to a method of reducing etch time needed for patterning an organic planarization layer so as to minimize damages to gate structures and fin structures in a block mask patterning process.

Fin field effect transistors (FinFETs) are one of the leading candidates to replace classical planar metal-oxide-semiconductor FETs (MOSFETs) for future complementary metal oxide semiconductor (CMOS) technologies due to the multiple-gate configuration of the fin device leading to an intrinsically superior short channel effect control. Conventionally, source/drain regions in FinFETs are formed by implanting dopants into fins and during the ion implantation, one of the devices types, e.g., n-type FinFETs (nFinFETs), must be covered or masked with a layer of material, such as photoresist, so dopants are implanted only into another device type, e.g., p-type FinFETs (pFinFETs).

Photolithography and etching processes are commonly used to define the masked regions and exposed regions. A typical prior art process uses a thin photoresist layer on top of a thick organic planarization layer (OPL) as a block mask. The OPL typically has a thickness ranging from 100 to 300 nm to planarize gate structures and fin structures with high topography. Standard lithographic processes are used to pattern the top photoresist layer and the resulting pattern is then transferred into the bottom OPL by an anisotropic etch such as, for example, reactive ion etching (RIE). However, since the thick OPL requires a much longer etch time, damages to the gate structures and the fin structures may occur during the RIE of the OPL, which in turn may cause defect formation in the subsequent processes, such as the epitaxial growth process to form raised source/drain regions. Therefore, there remains a need to develop block mask patterning processes that would overcome the disadvantages of the prior art approach.

SUMMARY

The present application provides a method to reduce etch time needed for patterning an organic planarization layer (OPL) in a block mask stack so as to minimize damages to gate structures and fin structures in a block mask patterning process. The block mask stack including an OPL, a developable antireflective coating (DARC) layer atop the OPL and a photoresist layer atop the DARC layer is employed to mask one conductivity type of FinFET, while exposing the other conductivity type of FinFET during source/drain ion implantation. The OPL is configured to have a minimum thickness sufficient to fill in spaces between semiconductor fins and to cover the semiconductor fins. The DARC layer is configured to planarize topography of semiconductor fins so as to provide a planar top surface for the ensuing lithography and etch processes.

In one aspect of the present application, a method of forming a semiconductor structure is provided. The method includes first forming a plurality of semiconductor fins on a substrate. A gate structure is then over a portion of each of the plurality of semiconductor fins. Next, an OPL is formed over the substrate. The OPL is deposited to a minimum thickness sufficient to fill in spaces between the plurality of semiconductor fins and to cover the plurality of semiconductor fins. A top surface of the OPL is non-planar. A DARC layer is then formed on the top surface of the OPL. The DARC layer provides a substantially planar top surface. After forming a photoresist layer on the top surface of the DARC layer, a portion of the photoresist layer is exposed to a radiation. The radiation creates a pattern in exposed portion of the photoresist layer and a portion of the DARC layer underlying the exposed portion of the photoresist layer. Next, the exposed portion of the photoresist layer and the portion of the DARC layer underlying the exposed portion of the photoresist layer are removed to expose a portion of the OPL. The exposed portion of the OPL is then removed to form an opening to expose a first set of the plurality of semiconductor fins and to leave a second set of the plurality of semiconductor fins covered.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
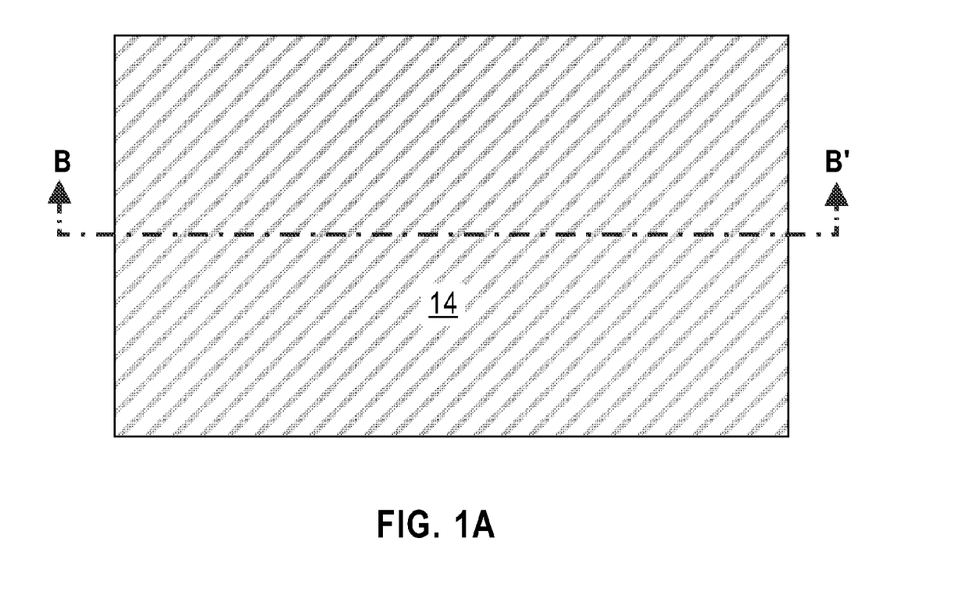
FIG. 1A is a top-down view of an exemplary semiconductor structure including a semiconductor substrate according to one embodiment of the present application.
Figure 1B:
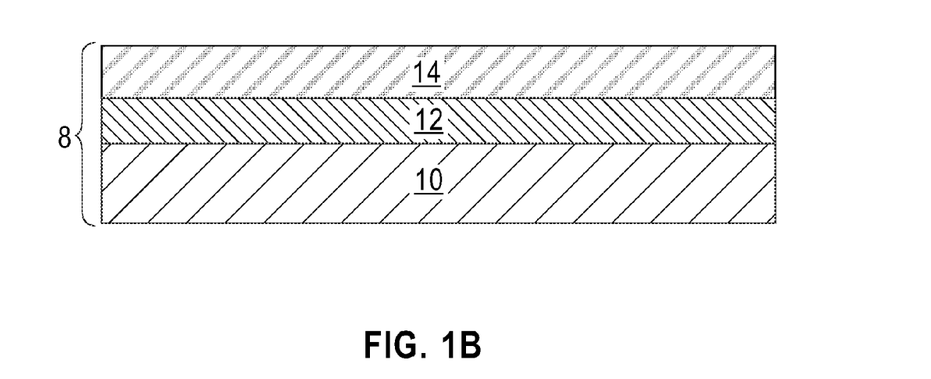
FIG. 1B is a cross-sectional view of the exemplary semiconductor structure of FIG. 1A along line B-B'.

Referring to FIGS. 1A and 1B, there are illustrated an exemplary semiconductor structure that can be employed according to an embodiment of the present application. Specifically, the semiconductor structure includes a semiconductor-on-insulator (SOI) substrate 8 containing a handle substrate 10, a buried insulator layer 12 and a top semiconductor layer 14.

In some embodiments of the present application, the handle substrate 10 can include a semiconductor material, such as, for example, Si, Ge, SiGe, SiC, SiGeC, and III/V compound semiconductors. The handle substrate 10 provides mechanical support to the buried insulator layer 12 and the top semiconductor layer 14. The thickness of the handle substrate 10 can be from 30 μm to about 2 mm, although less and greater thicknesses can also be employed.

The buried insulator layer 12 includes a dielectric material such as silicon oxide, silicon nitride, silicon oxynitride, or a combination thereof. The thickness of the buried insulator layer 12 can be from 50 nm to 200 nm, with a thickness from 100 nm to 150 nm being more typical.

The top semiconductor layer 14 can include a semiconductor material such as, for example, Si, Ge, SiGe, SiC, SiGeC, and III/V compound semiconductors such as, for example, InAs, GaAs, and InP. The semiconductor materials of the top semiconductor layer 14 and the handle substrate 10 may be the same or different. Typically, each of the handle substrate 10 and the top semiconductor layer 14 comprises a single crystalline semiconductor material, such as, for example, single crystalline silicon. The top semiconductor layer 14 may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, with a thickness from 30 nm to 70 nm being more typical.

In some embodiments of the present application, a hard mask layer (not shown) can be formed on the top semiconductor layer 14 prior to forming the semiconductor fins. When employed, the hard mask layer may comprise an oxide, nitride, oxynitride or any combination thereof including multilayers. In one embodiment, the hard mask layer includes silicon oxide or silicon nitride. The hard mask layer can be formed utilizing a conventional deposition process such as, for example, chemical vapor deposition (CVD), plasma enhanced chemical vapor deposition (PECVD), chemical solution deposition, evaporation or other like deposition processes. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, with a thickness from 30 nm to 60 nm being more typical.

Figure 2A:
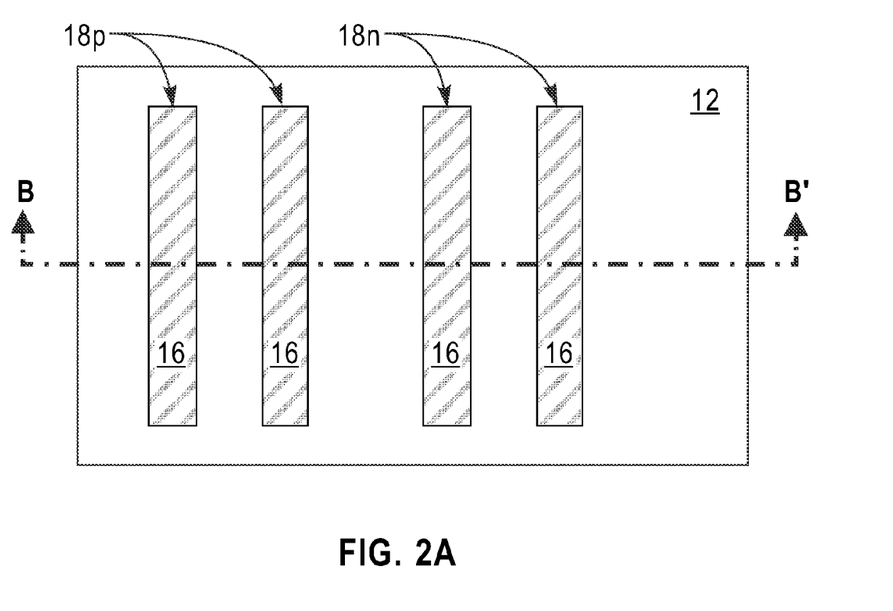
FIG. 2A is a top-down view of the semiconductor structure of FIG. 1A after forming a plurality of semiconductor fins on a substrate including a buried insulator layer and a handle substrate.
Figure 2B:
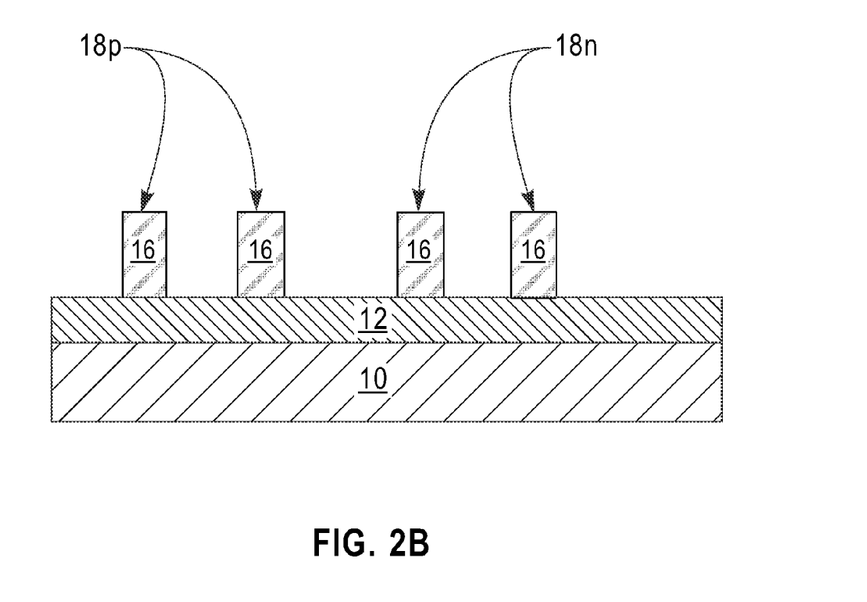
FIG. 2B is a cross-sectional view of the semiconductor structure of FIG. 2A along line B-B'.

Referring to FIGS. 2A and 2B, the top semiconductor layer 14 is patterned to form a plurality of semiconductor fins 18n, 18p. In the drawings and by way of illustration, the semiconductor fins designated as 18n are used for nFinFET devices, while the semiconductor fins designated as 18p are used for pFinFET devices. The semiconductor fin 18n, 18p includes remaining non-etched portions of the top semiconductor layer 14 which are designated as 16 herein.

In one embodiment, the semiconductor fins 18n, 18p can be formed by lithography and etching. The lithographic step includes applying a photoresist layer (not shown) atop the top semiconductor layer 14 (or the hard mask, if present), exposing the photoresist layer to a desired pattern of radiation, and developing the exposed photoresist layer utilizing a conventional resist developer. The etching process comprises dry etching and/or wet chemical etching. Illustrative examples of suitable dry etching processes that can be used in the present application include RIE, ion beam etching, plasma etching or laser ablation. Typically, a RIE process or an ion beam etching process is used. The etching process transfers the pattern from the patterned photoresist layer to the top semiconductor layer 14 or first to the hard mask layer, if present, and thereafter to underlying top semiconductor layer 14 utilizing the buried insulator layer 12 as an etch stop. After transferring the pattern into the top semiconductor layer 14, the patterned photoresist layer can be removed utilizing a conventional resist stripping process such as, for example, ashing. Alternatively, the semiconductor fins 18n, 18p can also be formed utilizing a sidewall image transfer (SIT) process. In a typical SIT process, spacers are formed on a dummy mandrel. The dummy mandrel is removed and the remaining spacers are used as a hard mask to etch the top semiconductor layer 14. The spacers are then removed after the semiconductor fins have been formed.

Each of the semiconductor fins 18n, 18p that is formed may have a height ranging from 1 nm to 150 nm, with a height ranging from 10 nm to 50 nm being more typical. Each of the semiconductor fins 18n, 18p may have a width ranging from 5 nm to 40 nm, with a width ranging from 10 nm to 20 nm being more typical. Adjacent semiconductor fins 18n, 18p may be separated by a pitch ranging from 20 nm to 100 nm, with a pitch ranging from 30 nm to 50 nm being more typical.

In some embodiments of the present application and when the hard mask layer is present, the hard mask layer that remains atop the semiconductor fins 18n, 18p can be removed at this stage. The removal of the remaining non-etched portion of hard mask layer can be achieved by performing a selective etching process or by utilizing a planarization process such as chemical mechanical planarization.

Figure 3A:
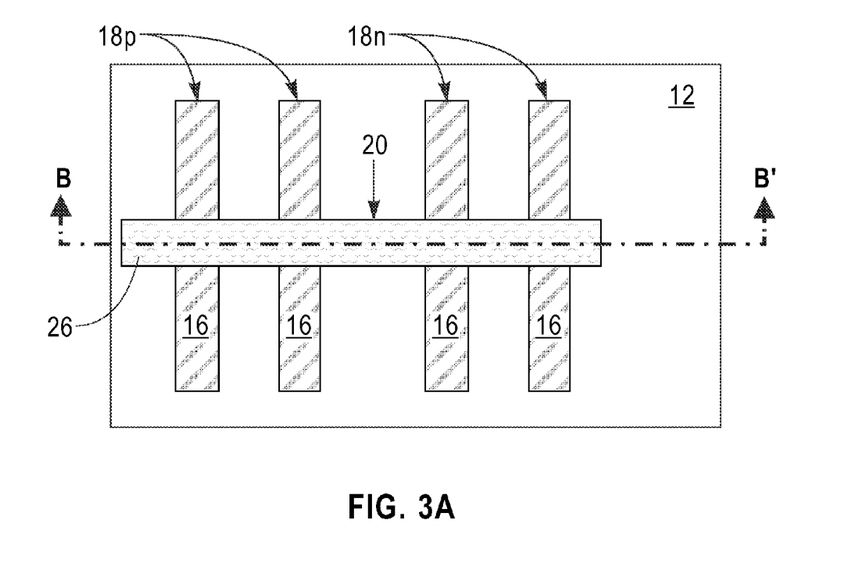
FIG. 3A is a top-down view of the semiconductor structure of FIG. 2A after forming a gate structure over a portion of each semiconductor fin.
Figure 3B:
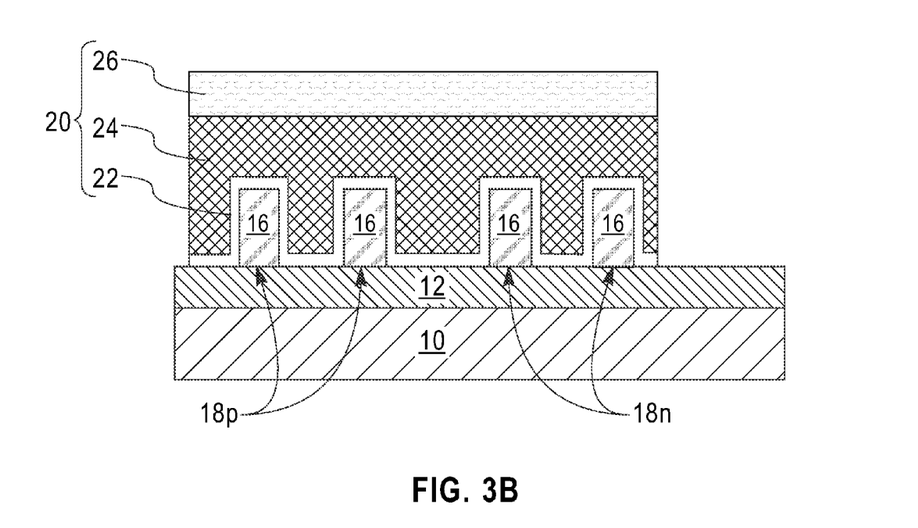
FIG. 3B is a cross-sectional view of the semiconductor structure of FIG. 3A along line B-B'.

Referring to FIGS. 3A and 3B, a gate structure 20 is formed over a portion of each of the semiconductor fins 18n, 18p. The gate structure 20 transverses (i.e., straddles) the semiconductor fins 18n, 18p. Although only one gate structure is described and illustrated, the present application is not limited to such a number of gate structures. Instead, a plurality of gate structures can be formed straddling each of the semiconductor fins 18n, 18p.

The gate structure 20 includes a gate dielectric 22 located on a top surface and sidewalls of each of semiconductor fins 18n, 18p, an overlying gate conductor 24 and a dielectric cap 26 atop the gate conductor 24. In some embodiments, the dielectric cap 26 can be omitted. The gate structure 20 can be formed by first providing a material stack of a gate dielectric layer, a gate conductor layer and a dielectric cap layer (not shown). The material stack can then be patterned by lithography and etching to provide the gate structure 20. The lithographic and etching processes employed in patterning the material stack can be the same as those mentioned above for patterning the semiconductor fins 18$n$, 18$p$.

The gate dielectric layer that provides the gate dielectric 22 of the gate structure 20 can include an oxide, nitride or oxynitride. In one example, the gate dielectric layer can include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric layer can be formed by any deposition technique including, for example, chemical vapor deposition (CVD), plasma enhanced chemical vapor deposition (PECVD), physical vapor deposition (PVD), atomic layer deposition (ALD) or sputtering. Alternatively, the gate dielectric layer can also be formed by a thermal growth process such as, for example, oxidation, nitridation or oxynitridation to convert surface portions of the semiconductor fins 18$n$, 18$p$ into a dielectric material. The gate dielectric layer that is formed can have a thickness ranging from 0.5 nm to 10 nm, with a thickness from 0.5 nm to about 3 nm being more typical.

The gate conductor layer that provides the gate conductor 24 of the gate structure 20 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material for semiconductor fins 18$n$ is different from the gate conductor material for semiconductor fins 18$p$. Different gate conductor materials can be formed by utilizing block mask technology.

The gate conductor layer can be formed utilizing a deposition process including, for example, CVD, PECVD, PVD, ALD, sputtering, or other like deposition processes. In embodiments in which polysilicon or SiGe are used as the gate conductor material, an in-situ deposition process can be used or alternatively deposition followed by ion implantation can be used. The gate conductor layer that is formed can have a thickness ranging from 50 nm to 200 nm, although lesser or greater thicknesses can also be employed.

The dielectric cap layer used in providing the dielectric cap 26 of the gate structure 20 can be comprised of a dielectric oxide, nitride or oxynitride. In one embodiment of the present application, the dielectric cap layer includes silicon nitride. The dielectric cap layer can be formed by a deposition process including, for example, CVD, PECVD, PVD, ALD or sputtering. The dielectric cap layer that is formed can have a thickness ranging from 25 nm to 100 nm, although lesser or greater thicknesses can also be employed.

In some embodiments of the present application, the gate structure 20 can be a sacrificial gate structure (not shown). The term "sacrificial gate structure" as used herein denotes a material that serves as a placeholder structure for a functional gate structure to be subsequently formed. The term "functional gate structure" as used herein denotes a permanent gate structure used to control output current (i.e., flow of carriers in the channel) of a semiconducting device through electrical fields. The sacrificial gate structure can be formed by first providing a blanket layer of a sacrificial gate material. The blanket layer of sacrificial gate material can be formed, for example, by CVD or PECVD. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure. The sacrificial gate structure can be replaced with a function gate structure after forming a source region and a drain region (collectively referred to hereinafter as "source/drain regions") utilizing ion implantation.

Figure 4A:
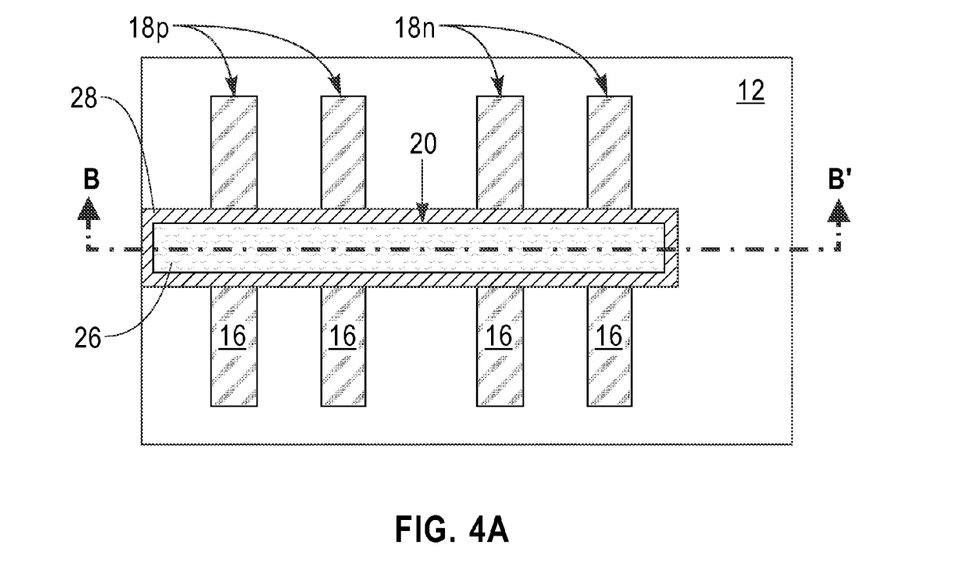
FIG. 4A is a top-down view of the semiconductor structure of FIG. 3A after forming a gate spacer on sidewalls of the gate structure.
Figure 4B:
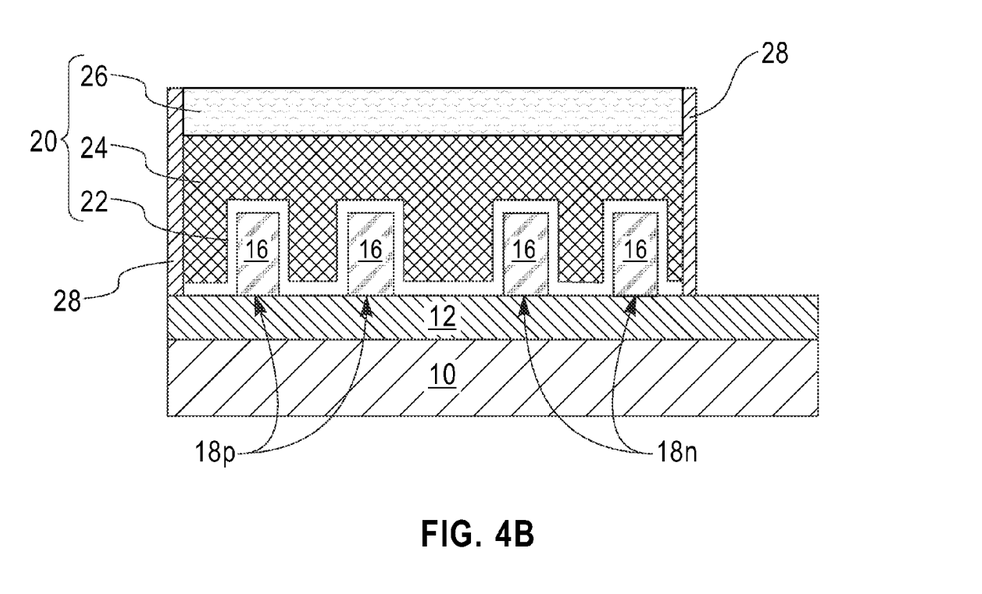
FIG. 4B is a cross-sectional view of the semiconductor structure of FIG. 4A along line B-B'.

Referring to FIGS. 4A-4B, a gate spacer 28 is formed on sidewalls of the gate structure 20. The gate spacer 28 can be formed by first depositing a conformal spacer material layer (not shown) on exposed surfaces of the gate structure 20 and the semiconductor fins 18$n$, 18$p$ utilizing any conventional deposition process including, for example, CVD or ALD. Alternatively, a thermal growth process including oxidation and/or nitridation can be employed in forming the spacer material layer. Following the formation of the conformal spacer material layer, horizontal portions of the conformal spacer material layer is removed by an anisotropic etch, such as, for example, a RIE process. In one embodiment, the RIE process is continued so that vertical portions of the conformal spacer material layer present on the sidewalls of the semiconductor fins 18$n$, 18$p$ are removed. The remaining vertical portions of the conformal spacer material layer constitute the gate spacer 28.

Materials used to form the gate spacer 28 may include a dielectric oxide, nitride or oxynitride. In one embodiment, the gate spacer 28 is composed of silicon nitride. The gate spacer 28 can have a thickness as measured at the bases ranging from 2 nm to 100 nm, with a thickness ranging from 6 nm to 10 nm being more typical.

Figure 5A:
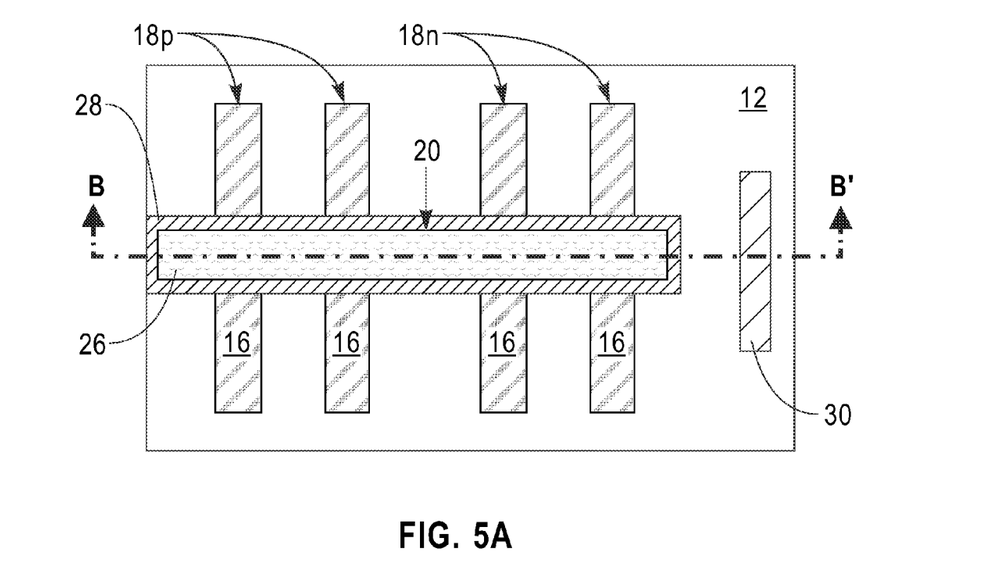
FIG. 5A is a top-down view of the semiconductor structure of FIG. 4A after forming a contact trench in the substrate.
Figure 5B:
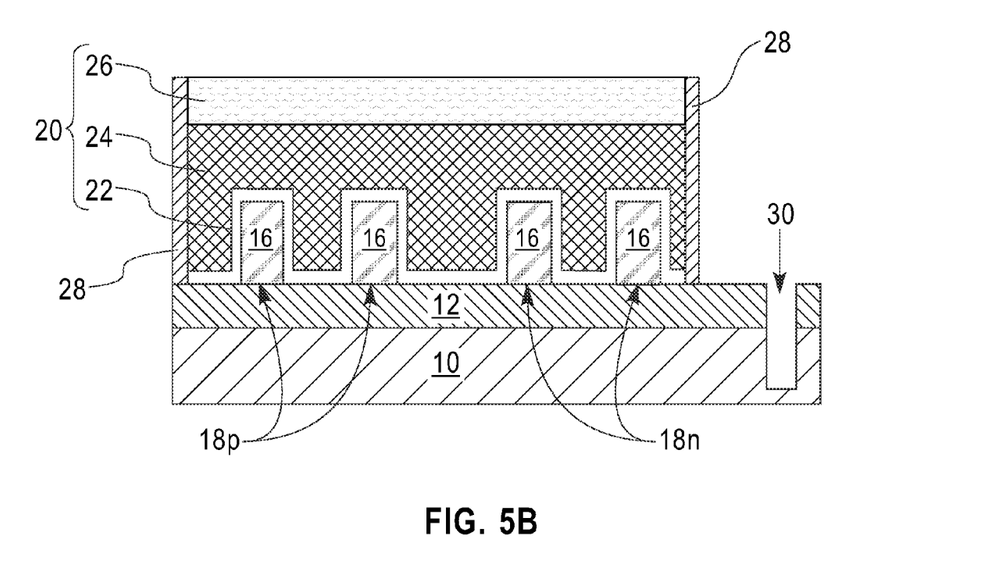
FIG. 5B is a cross-sectional view of the semiconductor structure of FIG. 5A along line B-B'.

Referring to FIGS. 5A and 5B, a contact trench 30 is formed in the substrate, i.e., the buried insulator layer 12 and the handle substrate 10, using conventional lithography and etching. A photoresist layer (not shown) is first applied onto the substrate and patterned by lithographic exposure and development. The resulting pattern in the photoresist layer is then transferred into the underlying substrate by an anisotropic etch. In one embodiment, the contact trench 30 can be formed by RIE or a combination of wet etching and RIE. The contact trench 30 that is formed extends through the buried insulator layer 12 and into the handle substrate 10. The contact trench 30 is typically etched down to a depth of about 300 nm with a minimum width of about 170 nm. This contact trench 30 will be later filled with an electrically conductive material to form a body contact. Exemplary electrically conductive materials include, but are not limited to, doped polysilicon and a metal such as tungsten.

Figure 6A:
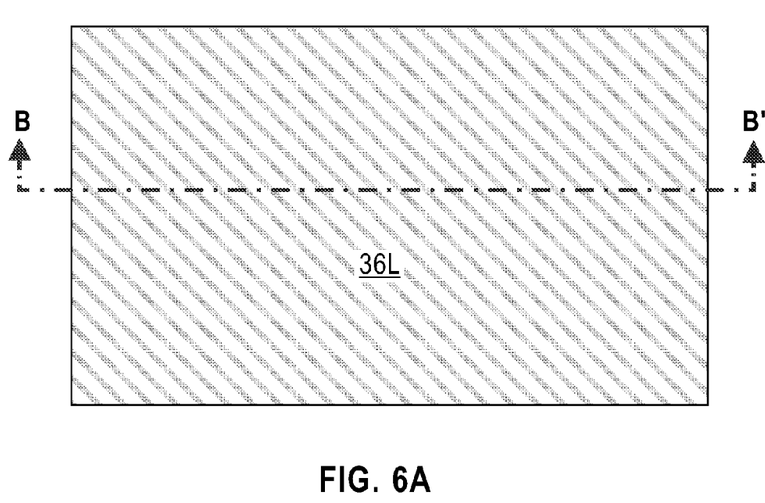
FIG. 6A is a top-down view of the semiconductor structure of FIG. 5A after forming a block mask stack including a photoresist layer, a developable antireflective coating (DARC) layer and an organic planarization layer (OPL) over the substrate.
Figure 6B:
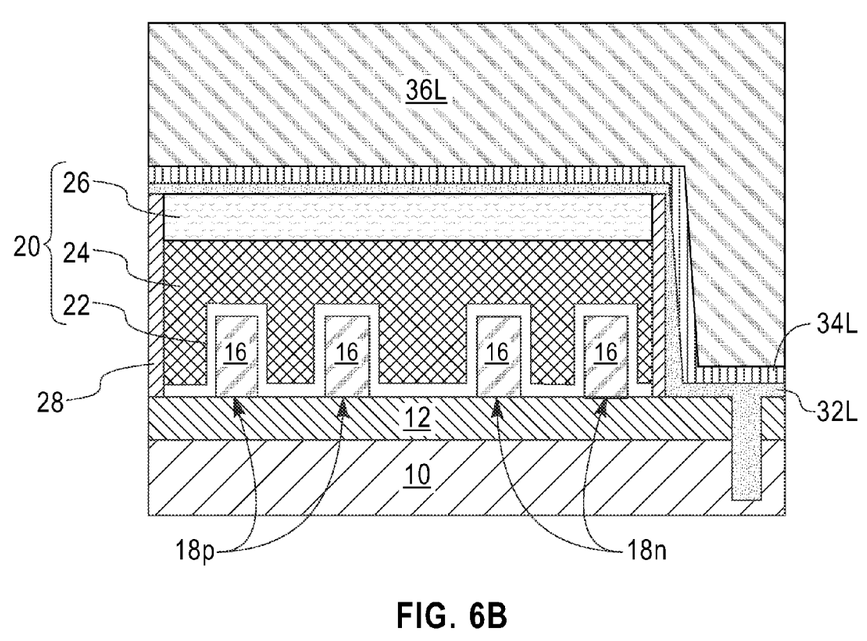
FIG. 6B is a cross-sectional view of the semiconductor structure of FIG. 6A along line B-B'.

Referring to FIGS. 6A-6B, a block mask stack is deposited over the semiconductor fins 18$p$, 18$n$, the gate structure 20 and exposed portions of the substrate. The block mask stack includes an organic planarization layer (OPL) 32L, a developable antireflective coating (DARC) layer 34L formed on the OPL 32L and a photoresist layer 36L formed on the DARC 34L.

The OPL layer 32L may include any suitable organic-based planarization material that can be blanket deposited to cover the semiconductor fins 18n, 18p and the gate structure 20. Exemplary organic planarization materials include, but are not limited to, polyacrylate resin, epoxy resin, phenol resin, polyamide resin, polyimide resin, unsaturated polyester resin, polyphenylenether resin, and polyphenylene sulfide resin. The OPL 32L can be formed by any suitable method, such as, for example, spinning coating, spray coating, dip coating, and roller coating.

The OPL 32L is deposited to a thickness sufficient to fill in spaces between the semiconductor fins 18n, 18p and the contact trench 30. In the present application, a minimum amount of the organic planarization material is used so long as the OPL 32L that is formed can cover the minimum dense semiconductor fins 18n, 18p. As a result, the etch time of the OPL layer 32L can be reduced to minimize damages to the dielectric cap 26, the gate spacers 28 and the semiconductor fins 18n, 18p. In one embodiment, the OPL 32L can have a thickness ranging from 40 nm to 60 nm.

The DARC layer 34L include an organic liquid coating material that is soluble in a developer so that it can be removed during the resist development step. Exemplary developable antireflective materials that can be employed in the present application include, but are not limited to, photosensitive (PS) antireflective material includes a polymer containing carboxylic acid moieties combined with multiple crosslinkers, photoacid generator, quencher, and solvents. In one embodiment, the DARC layer 34L is composed of a silicon-containing developable antireflective material.

The DARC layer 34L can be formed by any suitable method, such as, for example, spinning coating, spray coating, dip coating and roller coating. The solvent used to form the DARC layer solution typically does not dissolve the underlying OPL 32L. The DARC layer 34L may be baked to remove any casting solvent from the DARC layer 34L and cause the polymer in the DARC layer 34L to crosslink. The DARC layer 34L that is formed can have a thickness ranging from 20 to 60 nm.

The DARC layer 34L is formed over the OPL 32L to a level which tends to form a planar top surface for the ensuing lithography and etch processes. The improvement in the OPL planarity with the DARC layer 34L allows using an OPL having a thickness less than that used in the conventional POR while ensuring good critical dimension control. Additionally, thinner OPL and the shorter etch time would avoid severe damage to semiconductor fin surfaces when removing the organic planarization materials from the contact trench 30. Furthermore, using a combination of a thinner OPL and DARC layer in the block mask stack of the present application would allow a good reflectivity control over semiconductor fins and gate structure. The OPL 32L can also function as an antireflective layer to reduce reflection from the semiconductor fins 18n, 18p and/or the substrate 8, while the overlying DARC layer 34L can be used to reduce reflection from those components in the semiconductor structure that are taller than the semiconductor fins 18n, 18p (e.g., gate structure 20).

The photoresist layer 36L can be any photoresist conventionally used in semiconductor industry, including 193 nm and 248 nm photoresists. Exemplary photoresists include, but are not limited to, polyacrylate and polyhydroxystyrene. The photoresist layer 36L may be formed by any standard method including spin coating. The photoresist layer 36L may be baked to remove any solvent from the photoresist and to improve the coherence of the photoresist layer 36L.

Figure 7A:
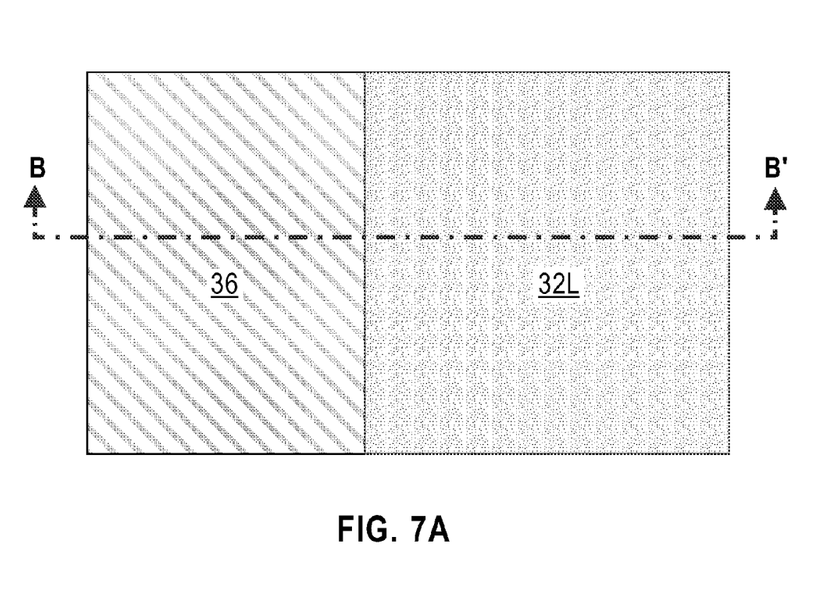
FIG. 7A is a top-down view of the semiconductor structure of FIG. 6A after patterning the photoresist layer and the DARC layer.
Figure 7B:
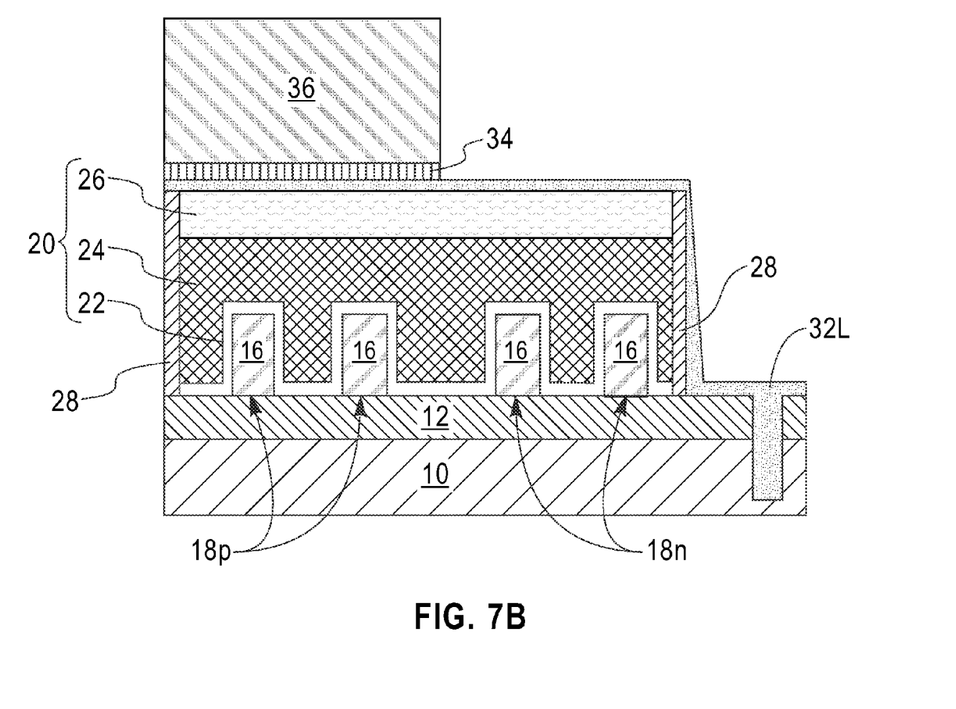
FIG. 7B is a cross-sectional view of the semiconductor structure of FIG. 7A along line B-B'.

Referring to FIGS. 7A and 7B, the photoresist layer 36L can be patterned using a typical photolithographic process where it is exposed to a radiation through a mask. The radiation also causes a portion of the DARC layer 34L underlying the exposed portion of the photoresist layer 34L become soluble in a developer. After the exposure, the exposed portion of the photoresist layer 34L can be removed using a developer, such as, for example, an aqueous alkaline solution. The portion of the DARC layer 34L underlying the exposed portion of the photoresist layer 34L may be soluble in the same developer and can be simultaneously removed with the exposed portion of the photoresist layer 34L, forming a resist pattern as shown in FIGS. 7A and 7B. A remaining portion of the photoresist layer 36L is herein referred to as patterned photoresist layer 36, and a remaining portion of DARC layer 34L is herein referred to as patterned DARC layer 34.

Figure 8A:
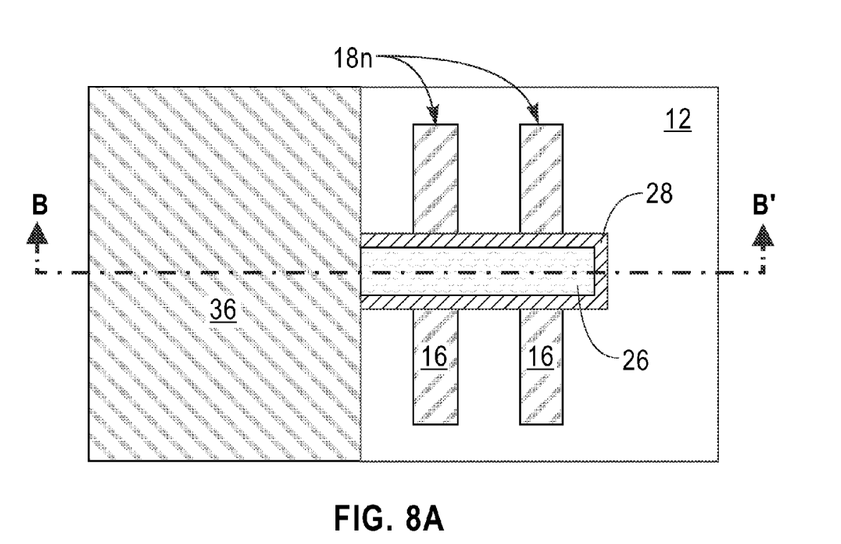
FIG. 8A is a top-down view of the semiconductor structure of FIG. 7A after opening the OPL to expose n-type semiconductor fins for ion implantation.
Figure 8B:
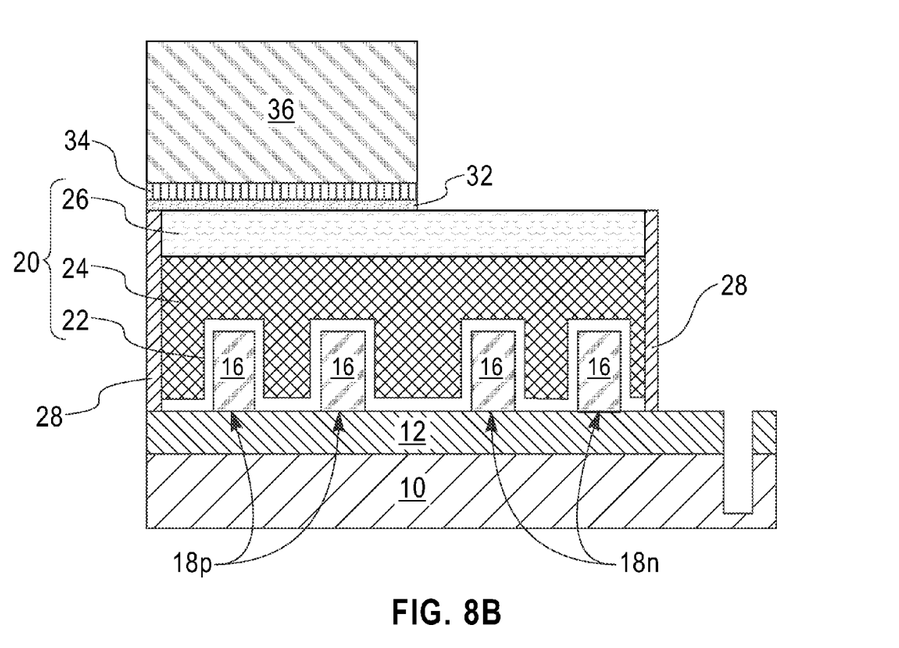
FIG. 8B is a cross-sectional view of the semiconductor structure of FIG. 8A along line B-B'.

Referring to FIGS. 8A and 8B, the resist pattern is transferred into the OPL 32L by removing a portion of the OPL 32L not covered by the patterned photoresist layer 36 and the patterned DARC layer 34, forming an opening as shown in FIGS. 8A and 8B. Typically, the exposed portion of the OPL 32L is removed by an anisotropic etch, such as, for example RIE. Since a thinner OPL 32L is employed in the present application, it can be etched and be completely removed from the spaces between the semiconductor fins 18n, 18p and the contact trench 30 in a much shorter time frame. Remaining portion of OPL 32L is herein referred to as patterned OPL 32. The opening that is formed exposes n-type semiconductor fins 18n and the contact trench 30, while p-type semiconductor fins 18p remain covered by the patterned photoresist layer 36, the patterned DARC layer 34 and the patterned OPL 32 (collectively referred to hereafter as "patterned block mask stack") for further processing, i.e. ion implantation process.

An angled ion implantation process is next performed through the opening to supply n-type dopants to portions of the exposed portions of the semiconductor fins 18n in the nFinFET region adjacent to the gate structure 20 so as to form source/drain regions in the semiconductor fins 18n on opposite sides of the gate structure 20 (not shown). In one embodiment, the implant is performed at an angle from 15° to 50° relative to the topmost surface of the substrate (i.e., buried insulator layer 12 and handle substrate 10). The semiconductor fins 18p in the pFinFET region are protected from this ion implantation process using the patterned block mask stack (32, 34, 36) as an ion implantation mask. For an nFinFET, the semiconductor fins 18n may be implanted with arsenic (As) or phosphorus (P). For clarity, the source/drain regions are not however shown in the drawings of the present application.

After ion implantation, layers in the patterned block mask stack (32, 34, 36) are sequentially removed. The patterned photoresist layer 36 can be first removed by a conventional stripping process, such as ashing. The patterned DARC layer 34 can be removed by conventional wets stripping process, such as sulfuric peroxide. The patterned OPL 32 can be removed by dry etching or chemical wet etching. In one embodiment, the patterned OPL 32 can be removed by sulfuric acid. Subsequently, the dopants in the source/drain regions can be activated by an anneal, such as repaid thermal anneal.

Source/drain regions in the semiconductor fins 18p in the pFinFET region can be formed by repeating the processes as described above for forming source/drain regions in the semiconductor fins 18n in the nFinFET region. For a pFinFET, the semiconductor fins 18p may be implanted with boron (B), indium (In), or gallium (B).

While the above figures illustrate using the block mask stack of the present application to mask semiconductor fins 18p while exposing semiconductor fins 18n for ion implantation in an nFinFET region before ion implantation in a pFinFET region, it will be appreciated that masking semiconductor fins 18p while exposing semiconductor fins 18p for ion implantation in a pFinFET region before ion implantation in an nFinFET region also is contemplated here. Additionally, as will be appreciated by those skilled in the art, the block mask stack of the present application may be applied to any process that requires a shorter RIE etch time of the OPL.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a plurality of semiconductor fins on a substrate comprising a buried insulator layer over a handle substrate;
   forming a gate structure over a portion of each of the plurality of semiconductor fins;
   forming a contact trench in the substrate, wherein the contact trench extends through the buried insulator layer and into the handle substrate;
   forming an organic planarization layer (OPL) over the substrate, wherein the OPL is deposited to a minimum thickness sufficient to fill in spaces between the plurality of semiconductor fins and to cover the plurality of semiconductor fins, and the OPL fills in the contact trench, and wherein a top surface of the OPL is non-planar;
   forming a developable antireflective coating (DARC) layer on the top surface of the OPL, wherein the DARC layer provides a substantially planar top surface;
   forming a photoresist layer on the top surface of the DARC layer;
   exposing a portion of the photoresist layer to a radiation, the radiation creating a pattern in exposed portion of the photoresist layer and a portion of the DARC layer underlying the exposed portion of the photoresist layer;
   removing the exposed portion of the photoresist layer and the portion of the DARC layer underlying the exposed portion of the photoresist layer to expose a portion of the OPL; and
   removing exposed portion of the OPL to form an opening, wherein the opening exposes a first set of the plurality of semiconductor fins and leaves a second set of the plurality of semiconductor fins covered.

2. The method of claim 1, wherein the plurality of semiconductor fins have a height ranging from 10 nm to 50 nm.

3. The method of claim 1, wherein the OPL comprises polyacrylate resin, epoxy resin, phenol resin, polyamide resin, polyimide resin, unsaturated polyester resin, polyphenylenether resin, or polyphenylene sulfide resin.

4. The method of claim 3, wherein the OPL has a thickness ranging from 40 nm to 60 nm.

5. The method of claim 1, wherein the DARC layer comprises a polymer containing carboxylic acid moieties with different crosslinker, photoacid generator, quencher, and solvents.

6. The method of claim 5, wherein the DARC layer has a thickness ranging from 20 nm to 60 nm.

7. The method of claim 1, wherein the photoresist layer comprises polyacrylate or polyhydroxystyrene.

8. The method of claim 1, wherein the removing the exposed portion of the photoresist layer and the portion of the DARC layer underlying the exposed portion of the photoresist layer is accomplished by a developer.

9. The method of claim 8, wherein the developer is an aqueous alkaline solution.

10. The method of claim 1, wherein the removing the exposed portion of the OPL is accomplished by reactive ion etching.

11. The method of claim 10, wherein the reactive ion etching of the OPL removes the OPL completely from the contact trench.

12. The method of claim 11, further comprising filling the contact trench with an electrically conductive material to provide a body contact.

13. The method of claim 12, wherein the electrically conductive material comprises doped polysilicon or a metal comprising tungsten.

14. The method of claim 1, further comprising implanting a first type dopant into portions of the exposed portions of the first set of the plurality of semiconductor fins on opposite sides of the gate structure to form source and drain regions in the first set of the plurality of semiconductor fins.

15. The method of claim 14, wherein the first set of the plurality of semiconductor fins comprises p-type semiconductor fins and the second set of the plurality of semiconductor fins comprises n-type semiconductor fins, and wherein the first type of dopant is an n-type dopant.

16. The method of claim 1, wherein the gate structure comprises a gate dielectric, a gate conductor and a dielectric cap.

17. The method of claim 1, further comprising forming a gate spacer on sidewalls of the gate structure.

* * * * *